(12) United States Patent
Chen et al.

(10) Patent No.: US 12,360,261 B2
(45) Date of Patent: Jul. 15, 2025

(54) PHOTOELECTRIC DETECTION CIRCUIT AND DRIVING METHOD THEREFOR, AND DETECTION SUBSTRATE AND RAY DETECTOR

(71) Applicant: BOE Technology Group Co., Ltd., Beijing (CN)

(72) Inventors: Jiangbo Chen, Beijing (CN); Fanli Meng, Beijing (CN); Tuo Sun, Beijing (CN); Zeyuan Li, Beijing (CN); Liye Duan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 219 days.

(21) Appl. No.: 17/921,589

(22) PCT Filed: May 25, 2021

(86) PCT No.: PCT/CN2021/095718
§ 371 (c)(1),
(2) Date: Oct. 26, 2022

(87) PCT Pub. No.: WO2021/244350
PCT Pub. Date: Dec. 9, 2021

(65) Prior Publication Data
US 2023/0168396 A1 Jun. 1, 2023

(30) Foreign Application Priority Data
Jun. 3, 2020 (CN) .......................... 202010493776.7

(51) Int. Cl.
*G01T 1/24* (2006.01)
*H10F 39/18* (2025.01)
(52) U.S. Cl.
CPC .............. *G01T 1/246* (2013.01); *G01T 1/247* (2013.01); *H10F 39/1892* (2025.01)

(58) Field of Classification Search
CPC ........... G01T 1/246; G01T 1/247; G01T 1/20; G01T 1/24; H01L 27/14659;
(Continued)

(56) References Cited

U.S. PATENT DOCUMENTS 9,735,183 B2 * 8/2017 Xu ...................... H01L 27/1259
2003/0038329 A1 * 2/2003 Fann ................. H01L 27/14659
257/431
(Continued)

FOREIGN PATENT DOCUMENTS

CN 1868064 A * 11/2006 ............. H04N 25/77
CN 102523391 A 6/2012
(Continued)

OTHER PUBLICATIONS

Fundamentals of Modern Electronic Measurement Technology (2nd Edition), Compiled by Han Jianguo, Weng Weiqin, Ke jingjie 2nd Edition, Beijing Metrology Publishing House, Jun. 2003. ISBN 7 5026 1782 5. p. 159.
(Continued)

*Primary Examiner* — Edwin C Gunberg
*Assistant Examiner* — Richard O Toohey
(74) *Attorney, Agent, or Firm* — IPro, PLLC

(57) ABSTRACT

A photoelectric detection circuit and a driving method therefor, and a detection substrate and a ray detector. The photoelectric detection circuit includes a storage circuit (101), an amplification circuit (102), a first reading circuit (103) and a second reading circuit (104), where the storage circuit (101), the amplification circuit (102) and the first reading circuit (103) cooperate with one another to realize a photoelectric detection function in an active mode; and the storage circuit (101) and the second reading circuit (104) cooperate with each other to realize a photoelectric detection function in a passive mode.

14 Claims, 9 Drawing Sheets

(58) Field of Classification Search
CPC ......... H01L 27/14609; H01L 27/14605; H01L 27/14663
See application file for complete search history.

(56) References Cited

U.S. PATENT DOCUMENTS

| | | |
|---|---|---|
| 2012/0313204 A1 | 12/2012 | Haddad et al. |
| 2015/0124142 A1 | 5/2015 | Hashimoto et al. |
| 2019/0305033 A1 | 10/2019 | Takenaka |
| 2019/0386045 A1* | 12/2019 | Shiota ............... H01L 27/14614 |

FOREIGN PATENT DOCUMENTS

| | | | | |
|---|---|---|---|---|
| CN | 102523393 A | * | 6/2012 | |
| CN | 103156343 A | | 6/2013 | |
| CN | 103163547 A | | 6/2013 | |
| CN | 105935296 A | | 9/2016 | |
| CN | 110115027 A | | 8/2019 | |
| CN | 110824328 A | | 2/2020 | |
| CN | 111650632 A | | 9/2020 | |
| CN | 111682040 A | * | 9/2020 | ............. G01T 1/247 |
| WO | 2004046698 A1 | | 6/2004 | |
| WO | 2015002613 A1 | | 1/2015 | |

OTHER PUBLICATIONS

CN202010493776.7 first office action.
CN202010493776.7 Decision of Rejection.
PCT/CN2021/095718 international search report.

* cited by examiner

PHOTOELECTRIC DETECTION CIRCUIT AND DRIVING METHOD THEREFOR, AND DETECTION SUBSTRATE AND RAY DETECTOR

CROSS REFERENCE TO RELATED APPLICATIONS

The present disclosure is a US National Stage of International Application No. PCT/CN2021/095718, filed on May 25, 2021, which claims priority to Chinese Patent Application No. 202010493776.7, filed to the China Patent Office on Jun. 3, 2020 and entitled "PHOTOELECTRIC DETECTION CIRCUIT AND DRIVING METHOD THEREFOR, AND DETECTION SUBSTRATE AND RAY DETECTOR", the entire contents of which are incorporated herein by reference.

FIELD

The present disclosure relates to the technical field of photoelectric detection, in particular to a photoelectric detection circuit and a driving method therefor, and a detection substrate and a ray detector.

BACKGROUND

The X-radiographic testing technology is widely applied to the fields such as industrial nondestructive testing, container scanning, circuit board inspection, medical treatment, security and protection, and industrial engineering, and has a wide application prospect. The traditional X-Ray imaging technology belongs to analog signal imaging, and is not high in resolution and relatively poor in image quality. The X-ray digital radio graphy (DR), emerged in the late 1990s, uses an X-ray flat detector to directly convert X-ray images into digital images, has become the leading direction of the digital X-ray photography technology, and has been recognized by clinical institutions and imaging experts all over the world due to its obvious advantages such as convenient operation, high imaging speed, high imaging resolution, clear converted digital images, and digital images being easy to save and transmit.

SUMMARY

A photoelectric detection circuit provided by an embodiment of the present disclosure includes:
  a storage circuit, coupled with an output end of a photoelectric sensor, where the storage circuit is configured to store a first photocurrent signal generated by the photoelectric sensor according to a received ray with a first radiation dosage, and store a second photocurrent signal generated by the photoelectric sensor according to a received ray with a second radiation dosage, and the first radiation dosage of the ray is smaller than the second radiation dosage of the ray;
  an amplification circuit, coupled with a storage circuit, where the amplification circuit is configured to amplify and then output the first photocurrent signal written;
  a first reading circuit, coupled with an output end of the amplification circuit and a detection signal receiving end receptively; where the first reading circuit is configured to write, under the control of a first scanning signal end, the first photocurrent signal amplified by the amplification circuit into the detection signal receiving end; and
  a second reading circuit, coupled with the storage circuit and the detection signal receiving end receptively; where the second reading circuit is configured to write, under the control of a second scanning signal end, the second photocurrent signal into the detection signal receiving end.

Optionally, in the above photoelectric detection circuit provided by the embodiment of the present disclosure, the detection signal receiving end is unique.

Optionally, in the above photoelectric detection circuit provided by the embodiment of the present disclosure, the detection signal receiving end includes a first detection signal end and a second detection signal end, the first detection signal end is coupled with the first reading circuit, and the second detection signal end is coupled with the second reading circuit.

Optionally, in the above photoelectric detection circuit provided by the embodiment of the present disclosure, the storage circuit includes: a capacitor, one end of the capacitor is grounded, and the other end of the capacitor is coupled with the output end of the photoelectric sensor.

Optionally, in the above photoelectric detection circuit provided by the embodiment of the present disclosure, the amplification circuit includes a first transistor, a gate of the first transistor is coupled with the output end of the photoelectric sensor, and a first electrode of the first transistor is coupled with a first power end.

Optionally, in the above photoelectric detection circuit provided by the embodiment of the present disclosure, the first reading circuit includes a second transistor, a gate of the second transistor is coupled with the first scanning signal end, a first electrode of the second transistor is coupled with a second electrode of the first transistor, and a second electrode of the second transistor is coupled with the detection signal receiving end.

Optionally, in the above photoelectric detection circuit provided by the embodiment of the present disclosure, the second reading circuit includes a third transistor, a gate of the third transistor is coupled with the second scanning signal end, the first electrode of the third transistor is coupled with the output end of the photoelectric sensor, and the second electrode of the third transistor is coupled with the detection signal receiving end.

Optionally, the above photoelectric detection circuit provided by the embodiment of the present disclosure further includes a reset circuit; and the reset circuit is coupled with the output end of the photoelectric sensor, and is configured to reset, under the control of a third scanning signal end, the output end of the photoelectric sensor by using a second power end.

Optionally, in the above photoelectric detection circuit provided by the embodiment of the present disclosure, the reset circuit includes a fourth transistor, a gate of the fourth transistor is coupled with the third scanning signal end, the first electrode of the fourth transistor is coupled with the second power end, and the second electrode of the fourth transistor is coupled with the output end of the photoelectric sensor.

In another aspect, an embodiment of the present disclosure further provides a driving method of the above photoelectric detection circuit, including:
  in an accumulating period, when the ray with the first radiation dosage is applied to the photoelectric sensor, storing the first photocurrent signal generated by the photoelectric sensor according to the ray with the first radiation dosage through the storage circuit; when the ray with the second radiation dosage is applied to the photoelectric sensor, storing the second photocurrent signal generated by the photoelectric sensor according to the ray with the second radiation dosage through the storage circuit; where the first radiation dosage of the ray is smaller than the second radiation dosage of the ray; and in a reading period, when the storage circuit stores the first photocurrent signal, loading the first scanning signal to the first scanning signal end, so that the first reading circuit writes the first photocurrent signal amplified by the amplification circuit into the detection signal receiving end; and when the storage circuit stores the second photocurrent signal, loading the second scanning signal to the second scanning signal end, so that the second reading circuit writes the second photocurrent signal stored by the storage circuit into the detection signal receiving end.

Optionally, the above driving method provided by the embodiment of the present disclosure, before the accumulating period, further includes: in a reset period, loading the third scanning signal to the third scanning signal end, so that the reset circuit resets the output end of the photoelectric sensor by using a second power end.

In another aspect, an embodiment of the present disclosure further provides a detection substrate, including: a base substrate; the above photoelectric detection circuits arranged on the base substrate in an array; and photoelectric sensors located on sides, facing away from the base substrate, of the photoelectric detection circuits and coupled with the photoelectric detection circuits in a one-to-one correspondence mode.

Optionally, in the above detection substrate provided by the embodiment of the present disclosure, same film layers of the transistors contained in each of the photoelectric detection circuits are arranged at the same layer, one end of the capacitor and the gates of the transistors are arranged at the same layer, and the other end of the capacitor is arranged at a same layer as the first electrodes and the second electrodes of the transistors.

Optionally, in the above detection substrate provided by the embodiment of the present disclosure, each of the photoelectric sensors includes: a first electrode coupled with the corresponding photoelectric detection circuit; a second electrode located on a side, facing away from the base substrate, of the first electrode; and a P-type semiconductor layer, an intrinsic semiconductor layer and an N-type semiconductor layer which are stacked between the first electrode and the second electrode.

Optionally, in the above detection substrate provided by the embodiment of the present disclosure, each of the photoelectric sensors includes: a first electrode coupled with the corresponding photoelectric detection circuit; a second electrode arranged at the same layer with the first electrode, a dielectric layer located on a side, facing away from the base substrate, of the layer where the first electrode and the second electrode are located; and a semiconductor layer located on a side, facing away from the base substrate, of the dielectric layer; and the first electrode and the second electrode constitute an interdigital electrode.

In another aspect, an embodiment of the present disclosure further provides a ray detector, including the above detection substrate.

DETAILED DESCRIPTION OF THE EMBODIMENTS

In order to enable objectives, technical solutions and advantages of the embodiments of the present disclosure more clearly, the technical solutions of the embodiments of the present disclosure will be described clearly and completely in combination with accompanying drawings of the embodiments of the present disclosure below. Thicknesses and shapes of films in the accompanying drawings do not reflect a true scale, and are only intended to illustrate contents of the present disclosure. Apparently, the described embodiments are only a part of the embodiments of the present disclosure, not all of the embodiments. Based on the described embodiments of the present disclosure, all other embodiments obtained by those of ordinary skill in the art without creative work shall fall within the protection scope of the present disclosure.

Unless otherwise defined, technical or scientific terms used herein shall have the ordinary meanings understood by those ordinarily skilled in the art to which the present disclosure pertains. The words "first", "second" and the like used in the specification and claims of the present disclosure do not represent any sequence, quantity or importance, but are used to distinguish different constituent parts. The words "comprise" or "include" and the like indicate that an element or item appearing before such word covers listed elements or items appearing after the word and equivalents thereof, and does not exclude other elements or items. The words "inner", "outer", "upper", "lower" and the like are merely used to represent a relative position relationship, and after an absolute position of a described object changes, the relative position relationship may change accordingly.

In the related art, a passive-type (PPS) ray detector is suitable for detection of high-dosage rays (such as X-rays, γ-rays or other rays), has the characteristics of high spatial resolution, high quantum detection efficiency and high signal-to-noise ratio; but because dosages of the rays are large, when the rays are used for dynamic detection and image reconstruction of a plurality of images, it is difficult to control the total dosage to a lower state. However, an active-type (APS) ray detector can meet requirements of low-dosage ray detection, but at high-dosage rays, imaging quality is not improved remarkably, and even the quantum detection efficiency and a signal-to-noise ratio are degraded to some extent. It is difficult to give full play to the advantages of both in high and low dosage detection.

Figure 1:
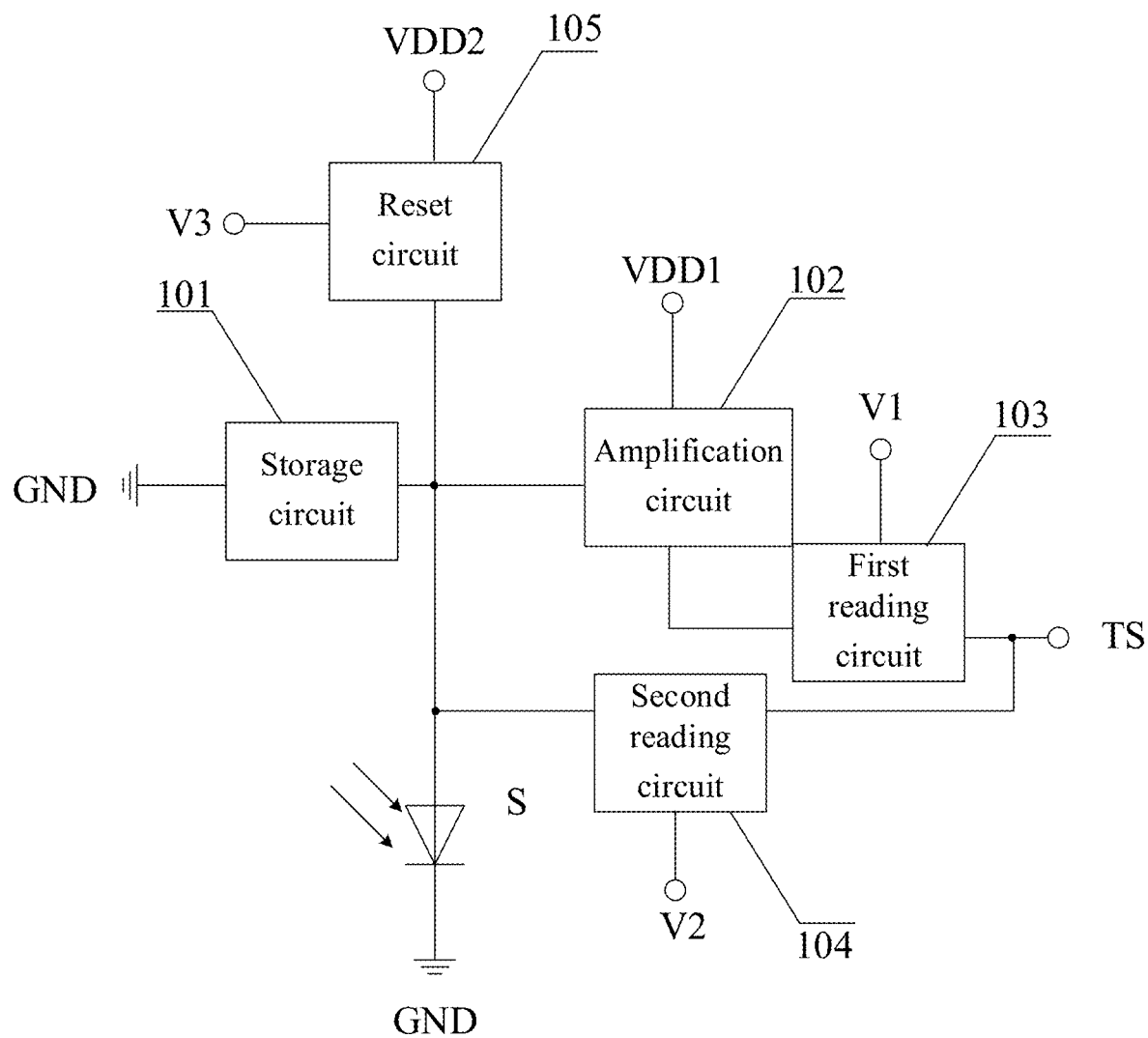
FIG. 1 and FIG. 2 are respectively schematic structural diagrams of photoelectric detection circuits provided by embodiments of the present disclosure.

Aiming at the above problems existing in the related art, embodiments of the present disclosure provide a photoelectric detection circuit, as shown in FIG. 1, including: a storage circuit 101, an amplification circuit 102, a first reading circuit 103 and a second reading circuit 104;

the storage circuit 101 is coupled with an output end of a photoelectric sensor S; the storage circuit 101 is configured to store a first photocurrent signal generated by the photoelectric sensor according to a received ray with a first radiation dosage, and write the first photocurrent signal into a control end of the amplification circuit 102; or, the storage circuit 101 is configured to store a second photocurrent signal generated by the photoelectric sensor according to a received ray with a second radiation dosage, and write the second photocurrent signal into an input end of the second reading circuit 104; wherein the first radiation dosage of the ray is smaller than the second radiation dosage of the ray;

the first reading circuit 103 is coupled with a detection signal receiving end TS; and the first reading circuit 103 is configured to write, under the control of a first scanning signal end V1, the first photocurrent signal amplified by the amplification circuit 102 into the detection signal receiving end TS; and the second reading circuit 104 is coupled with the detection signal receiving end TS; and the second reading circuit 104 is configured to write, under the control of a second scanning signal end V2, the second photocurrent signal into the detection signal receiving end TS.

In the above photoelectric detection circuit provided by the embodiments of the present disclosure, the first photocurrent signal generated by the photoelectric sensor and stored by the storage circuit 101 is written into the detection signal receiving end TS by the first reading circuit 103 after being amplified by the amplification circuit 102, so that a photoelectric detection function in an active mode (APS) is realized; and the second photocurrent signal generated by the photoelectric sensor and stored by the storage circuit 101 is directly written into the detection signal receiving end TS by the second reading circuit 104, so that a photoelectric detection function in a passive mode (PPS) is realized. Therefore, a ray detector of the present disclosure is compatible with an active mode (APS) and a passive mode (PPS), and simultaneously has the advantages of the two modes. Exemplarily, a doctor may first select a low-dosage APS mode to find lesions, and then manually switch to a high-dosage PPS mode to perform high resolution imaging on the lesions.

Figure 2:
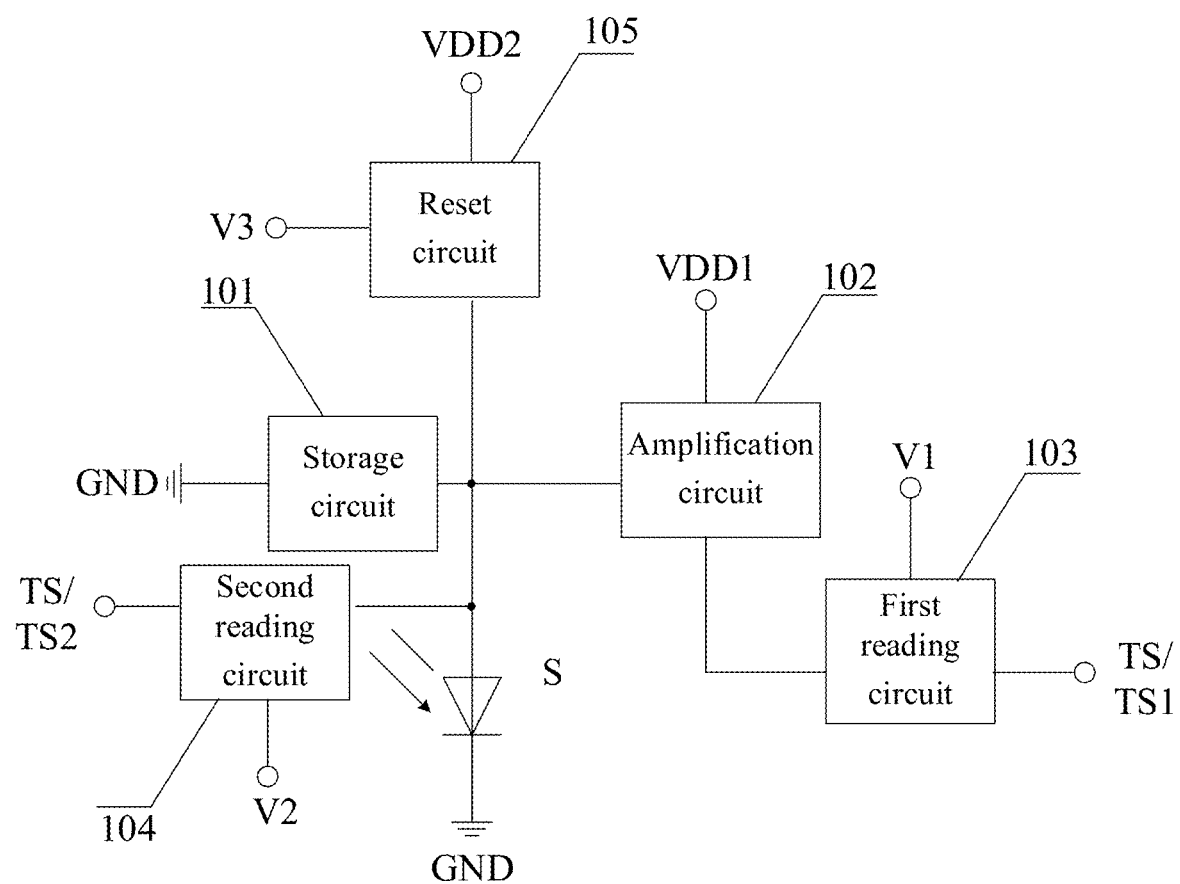

Optionally, in the above photoelectric detection circuit provided by the embodiments of the present disclosure, as shown in FIG. 1, the detection signal receiving end TS may be unique, that is, the first reading circuit 103 and the second reading circuit 104 share one detection signal receiving end, thereby increasing a use ratio of an external integrated circuit (IC) channel. Or, as shown in FIG. 2, the detection signal receiving end TS may include a first detection signal receiving end TS1 and a second detection signal receiving end TS2, the first detection signal receiving end TS1 is coupled with the first reading circuit 103, and the second detection signal receiving end TS2 is coupled with the second reading circuit 104.

A working principle of the above photoelectric detection circuit provided by the embodiments of the present disclosure is introduced below in combination with a working sequence diagram and specific embodiments corresponding to the above photoelectric detection circuit provided by the embodiments of the present disclosure. In addition, it should be noted that the following is only an example of a specific structure of each circuit, and during specific implementation, the specific structure of each circuit is not limited to the following structure provided by the embodiments of the present disclosure, and may also be other structures known by those skilled in the art, which is not limited herein.

Figure 3:
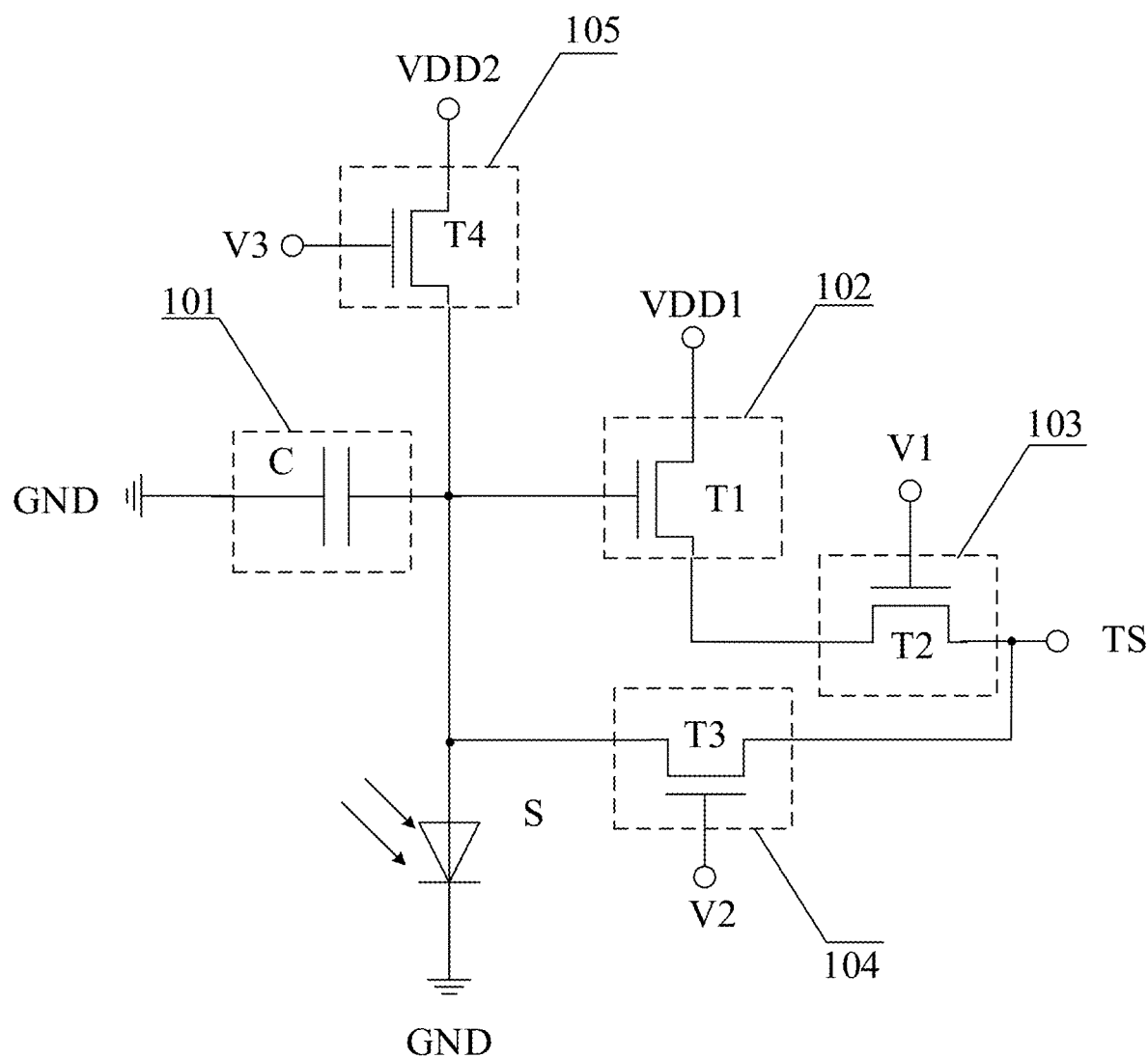
FIG. 3 and FIG. 4 are respectively specific schematic structural diagrams of photoelectric detection circuits provided by embodiments of the present disclosure.
Figure 4:
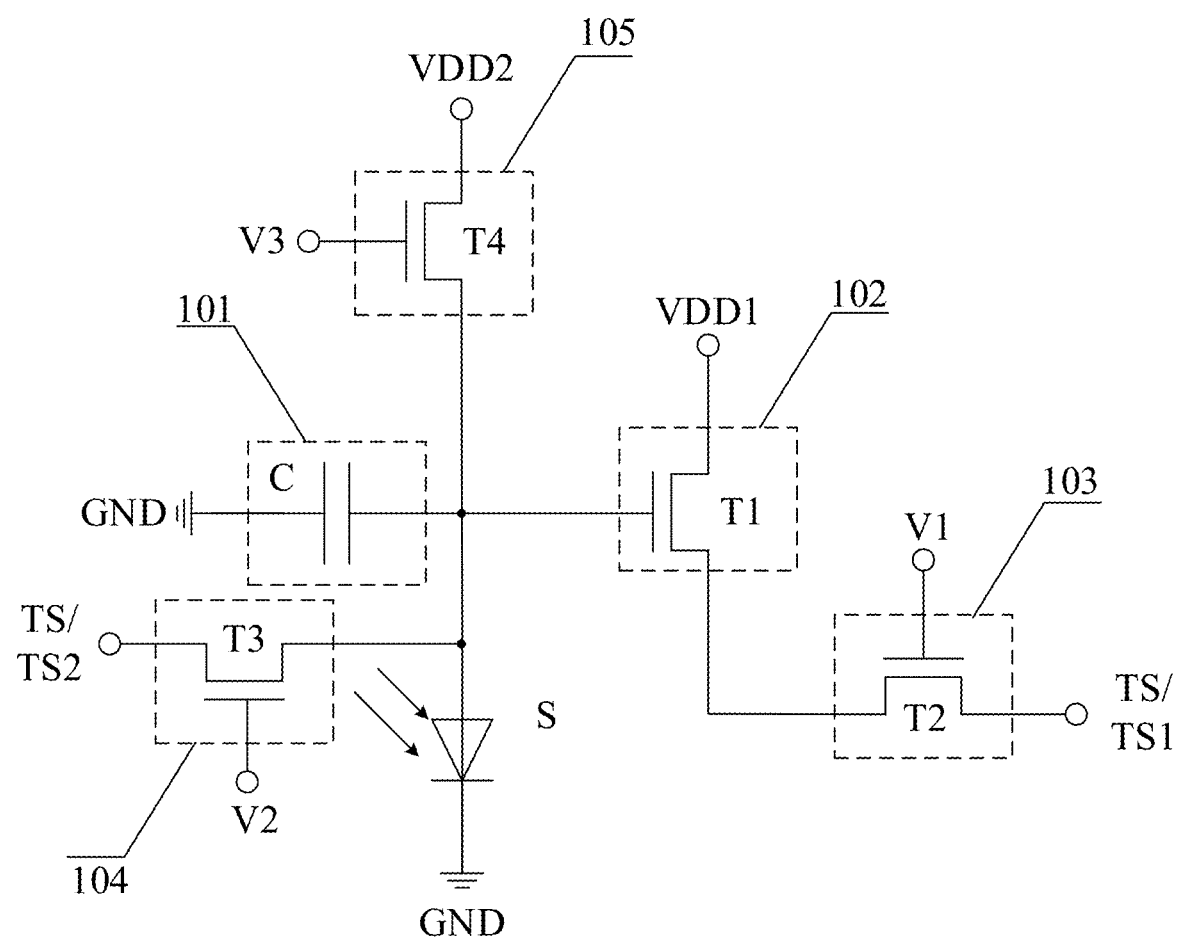

Optionally, in the above photoelectric detection circuit provided by the embodiments of the present disclosure, as shown in FIG. 3 and FIG. 4, the storage circuit 101 includes a capacitor C, one end of the capacitor C is grounded (GND), and the other end of the capacitor C is coupled with the output end of the photoelectric sensor S.

Figure 5:
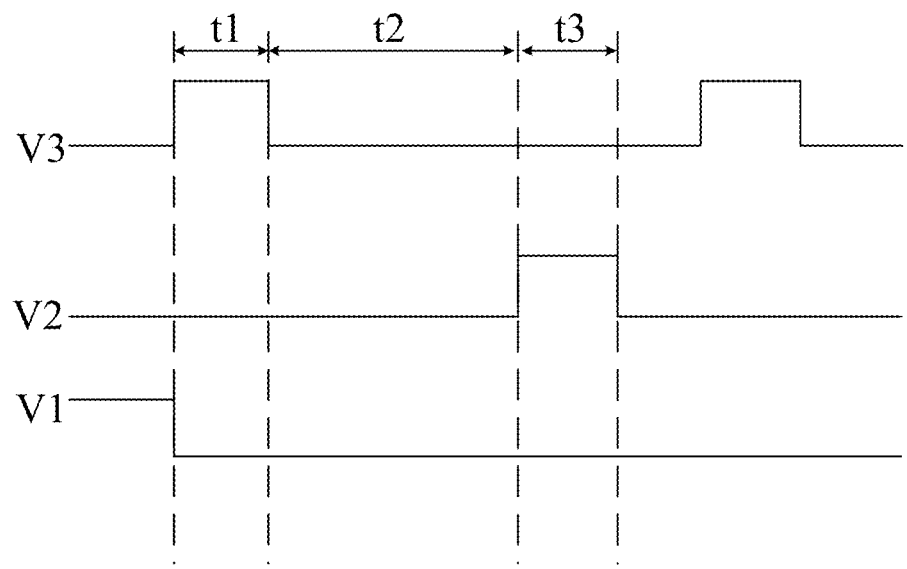
FIG. 5 is a working sequence diagram of a photoelectric detection circuit in an active mode provided by an embodiment of the present disclosure.
Figure 6:
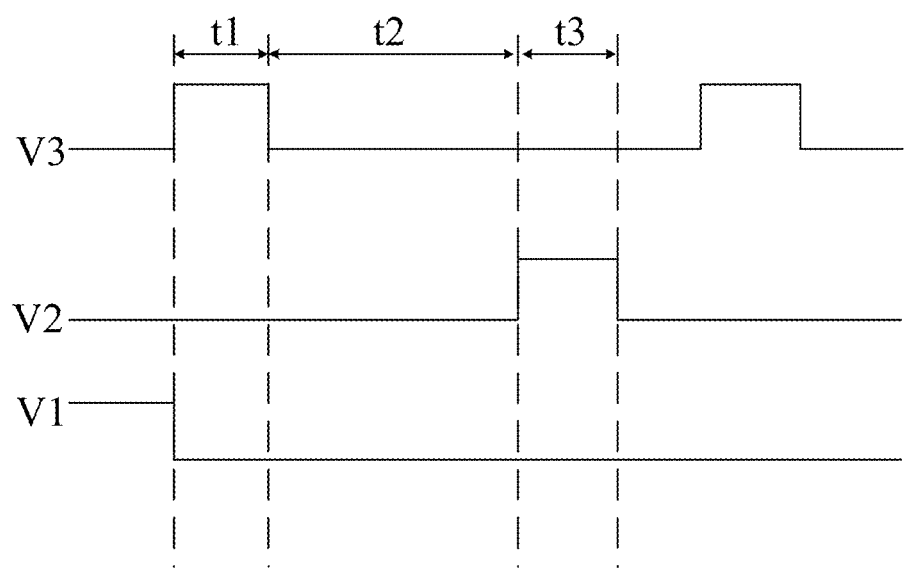
FIG. 6 is a working sequence diagram of a photoelectric detection circuit in a passive mode provided by an embodiment of the present disclosure.

Specifically, as shown in FIG. 5, in the accumulating period t2 in the active mode (APS), transistors are in a cut-off state, rays with smaller radiation dosages (such as 1 $\mu Gy$) are converted into visible light by a scintillator layer of the ray detector and then illuminated to the photoelectric sensor, the photoelectric sensor responds to the received visible light to generate a first photocurrent signal, and the first photocurrent signal is stored by the capacitor C. As shown in FIG. 6, in the accumulating period t2 in the passive mode (PPS), the transistors are in a cut-off state, rays with larger radiation dosages (such as 20 $\mu Gy$) are converted into visible light by the scintillator layer of the ray detector and then illuminated to the photoelectric sensor, the photoelectric sensor responds to the received visible light to generate a second photocurrent signal, and the second photocurrent signal is stored by the capacitor C.

Optionally, in the above photoelectric detection circuit provided by the embodiments of the present disclosure, as shown in FIG. 3 and FIG. 4, the amplification circuit 102 includes a first transistor T1, a gate of the first transistor T1 is coupled with the output end of the photoelectric sensor S, and a first electrode of the first transistor T1 is coupled with a first power end VDD1.

Optionally, in the above photoelectric detection circuit provided by the embodiments of the present disclosure, as shown in FIG. 3 and FIG. 4, the first reading circuit 103 includes a second transistor T2, a gate of the second transistor T2 is coupled with the first scanning signal end V1, a first electrode of the second transistor T2 is coupled with a second electrode of the first transistor T1, and a second electrode of the second transistor T2 is coupled with the detection signal receiving end TS.

Specifically, as shown in FIG. 5, in the reading period t3 in the active mode (APS), the first transistor T1 is conducted under the control of the first photocurrent signal stored by the capacitor C, and amplifies and then writes the first photocurrent signal into the second transistor T2; and the second transistor T2 is conducted under the control of the first scanning signal end V1, and writes the amplified first photocurrent signal into the detection signal receiving end TS.

Optionally, in the above photoelectric detection circuit provided by the embodiments of the present disclosure, as shown in FIG. 3 and FIG. 4, the second reading circuit 104 includes a third transistor T3, a gate of the third transistor T3 is coupled with the second scanning signal end V2, the first electrode of the third transistor T3 is coupled with the output end of the photoelectric sensor S, and the second electrode of the third transistor T3 is coupled with the detection signal receiving end TS.

Specifically, as shown in FIG. 6, in the reading period t3 in the passive mode (PPS), the third transistor T3 is conducted under the control of the second scanning signal end V2, and the second photocurrent signal stored by the capacitor C is written into the detection signal receiving end TS.

Optionally, the above photoelectric detection circuit provided by the embodiments of the present disclosure, as shown in FIG. 1 and FIG. 2, further includes a reset circuit 105; the reset circuit 105 is coupled with the output end of the photoelectric sensor S; and the reset circuit 105 is configured to reset, under the control of a third scanning signal end V3, the output end of the photoelectric sensor S by using a second power end VDD2, so as to prevent that photocurrent residues in a detection process of a previous frame affect a photoelectric detection result of a current frame.

Optionally, in the above photoelectric detection circuit provided by the embodiments of the present disclosure, as shown in FIG. 5 and FIG. 6, the reset circuit 105 includes a fourth transistor T4, a gate of the fourth transistor T4 is coupled with the third scanning signal end V3, the first electrode of the fourth transistor T4 is coupled with the second power end VDD2, and the second electrode of the fourth transistor T4 is coupled with the output end of the photoelectric sensor S.

Specifically, in a reset period t1 in the active mode (APS) shown in FIG. 5 and the passive mode (PPS) shown in FIG. 6, the fourth transistor T4 is conducted under the control of the third scanning signal end V3, so that the second power end VDD2 resets the output end of the photoelectric sensor S through the conducted fourth transistor T4.

It should be noted that in the above photoelectric detection circuit provided by the embodiments of the present disclosure, the transistors are generally made of the same materials, and during specific implementation, in order to simplify a manufacturing process, the above first transistor to the fourth transistor all adopt a P-type transistor or an N-type transistor. In addition, the first electrodes and the second electrodes of the above transistors are respectively source electrodes and drain electrodes, and according to differences of types of the transistors and input signals, functions of the transistors may be interchanged, which is not specifically distinguished herein. In addition, signals loaded to the first power end VDD1 and the second power end VDD2 need to be set according to the types of the first transistor T1 and the fourth transistor T4 and gate potentials of the first transistor T1 and the fourth transistor T4, so that the first transistor T1 and the fourth transistor T4 are correspondingly conducted or cut off in the above three periods, which is not specifically limited herein.

It is known from the above contents that one specific implementation of the photoelectric detection circuit provided by the embodiments of the present disclosure only includes four transistors and one capacitor, so as to realize a switching function of the active mode (APS) and the passive mode (PPS), and the structure is relatively simple. In addition, introduction of the more transistors may cause large noises, which affects detection accuracy, however, the number of the transistors in the present disclosure is small, thereby reducing the noises to some extent, and increasing the signal-to-noise ratio.

Based on the same inventive concept, embodiments of the present disclosure further provide a driving method of the photoelectric detection circuit, since a principle of the driving method for solving the problem is the same with a principle of the above photoelectric detection circuit for solving the problem, so implementation of the driving method may refer to the specific embodiments of the above photoelectric detection circuit, and the repetition is omitted.

Specifically, the driving method of the above photoelectric detection circuit provided by the embodiments of the present disclosure may specifically include the following steps:

in the accumulating period, the ray with the first radiation dosage is loaded to the photoelectric sensor, so that the storage circuit stores the first photocurrent signal generated by the photoelectric sensor according to the ray with the first radiation dosage; or, the ray with the second radiation dosage is loaded to the photoelectric sensor, so that the storage circuit stores the second photocurrent signal generated by the photoelectric sensor according to the ray with the second radiation dosage; where the first radiation dosage of the ray is smaller than the second radiation dosage of the ray; and in the reading period, the first scanning signal is located to the first scanning signal end, so that the first reading circuit writes the first photocurrent signal amplified by the amplification circuit into the detection signal receiving end; or, the second scanning signal is located to the second scanning signal end, so that the second reading circuit writes the second photocurrent signal stored by the storage circuit into the detection signal receiving end.

Optionally, in the above driving method provided by the embodiments of the present disclosure, before the accumulating period, the following steps may also be executed: in the reset period, the third scanning signal is located to the third scanning signal end, so that the reset circuit resets the output end of the photoelectric sensor by using the second power end.

Figure 7:
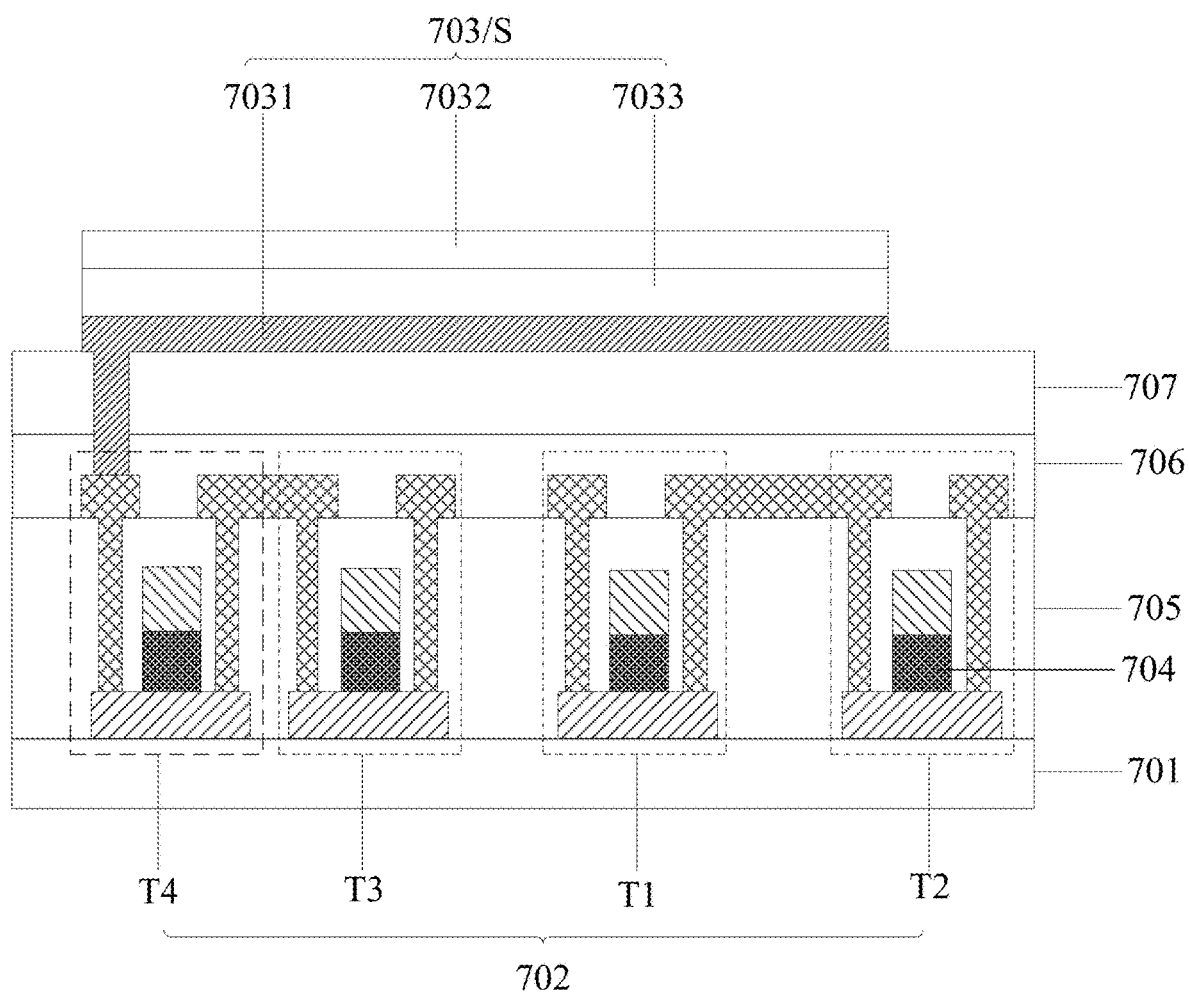
FIG. 7 to FIG. 10 are respectively schematic structural diagrams of a detection substrate provided by embodiments of the present disclosure.
Figure 8:
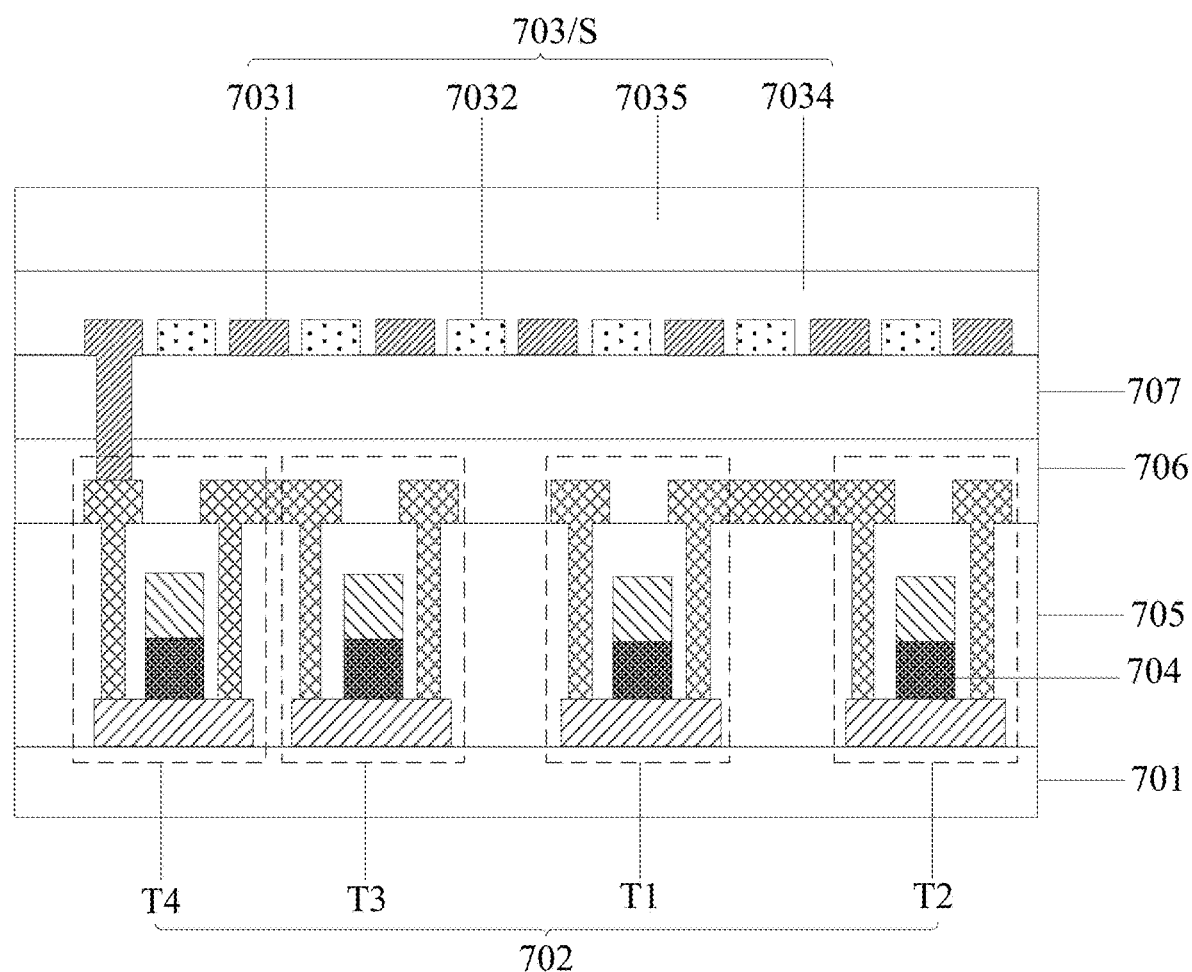

Based on the same inventive concept, embodiments of the present disclosure further provide a detection substrate, as shown in FIG. 7 and FIG. 8, and the detection substrate includes a base substrate 701, photoelectric detection circuits 702 arranged on the base substrate 701 in an array, and photoelectric sensors S located on sides, facing away from the base substrate 701, of the photoelectric detection circuits 702 and coupled with the photoelectric detection circuits 702 in a one-to-one correspondence mode. Since the principle of the detection substrate for solving the problem is the same with the principle of the above photoelectric detection circuits for solving the problem, implementation of the detection substrate may refer to the specific embodiments of the above photoelectric detection circuits, and the repetition is omitted.

Optionally, in the above detection substrate provided by the embodiments of the present disclosure, as shown in FIG. 7 and FIG. 8, the same film layers (including active layers, gates, and source and drain electrodes) of the transistors (specifically including the first transistor T1, the second transistor T2, the third transistor T3 and the fourth transistor T4) contained in each of the photoelectric detection circuits 702 are arranged at the same layer; and one end of each capacitor C and the gates of the transistors are arranged at the same layer, and the other end of the each capacitor C and the first electrodes and the second electrodes of the transistors are arranged at the same layer.

Optionally, in the above detection substrate provided by the embodiments of the present disclosure, the photoelectric sensors S may be a positive-intrinsic-negative-type (PIN-type) photosensor 703, and may also be a metal-semiconductor-metal-type (MSM-type) photosensor 703.

Specifically, when the photoelectric sensor S is the PIN-type photosensor 703, as shown in FIG. 7, the photoelectric sensor S includes: a first electrode 7031 coupled with the corresponding photoelectric detection circuit 702; a second electrode 7032 located on a side, facing away from the base substrate 701, of the first electrode 7031; and a P-type semiconductor layer, an intrinsic semiconductor layer and an N-type semiconductor layer which are stacked between the first electrode 7031 and the second electrode 7032. Specifically, 7033 in FIG. 7 represents a stack structure of the P-type semiconductor layer, the intrinsic semiconductor layer and the N-type semiconductor layer.

Figure 9:
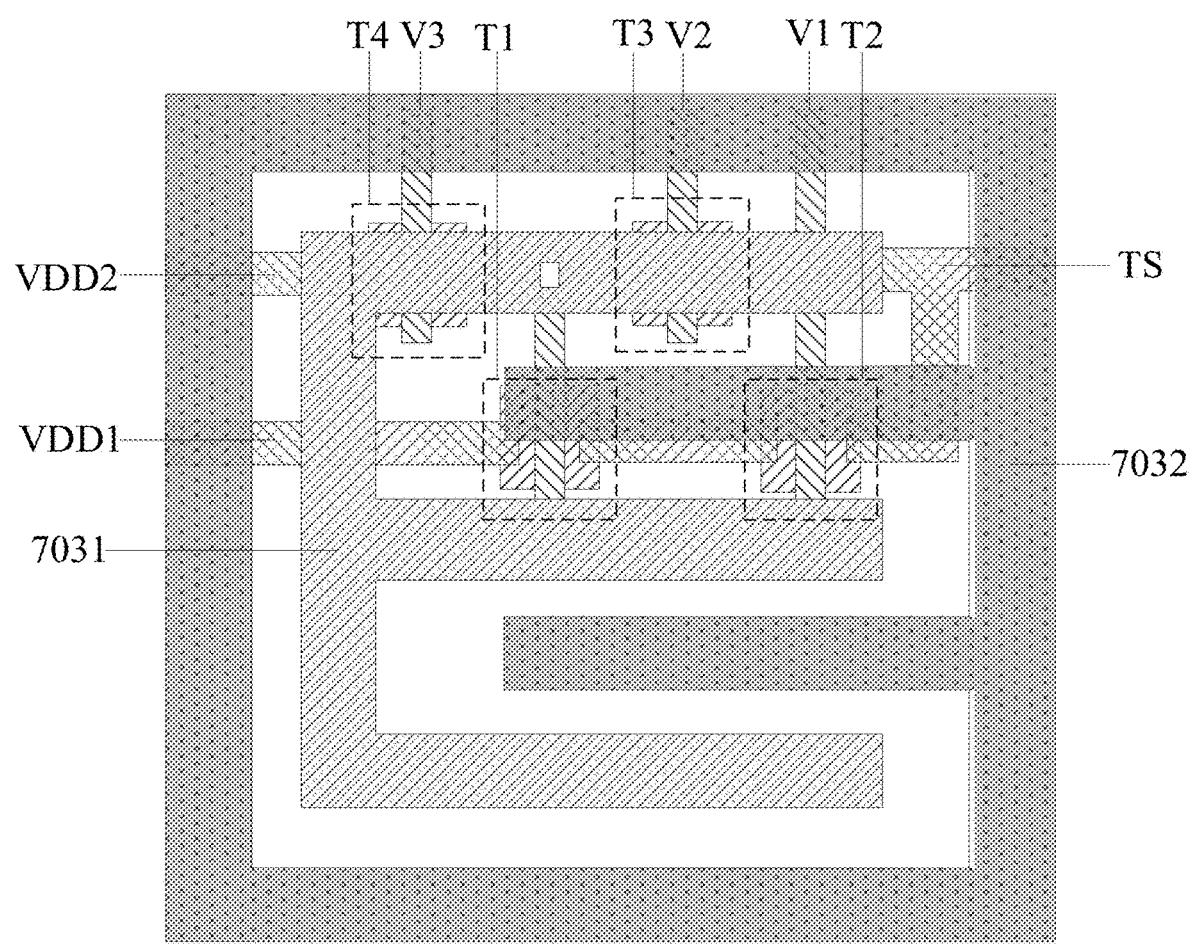
Figure 10:
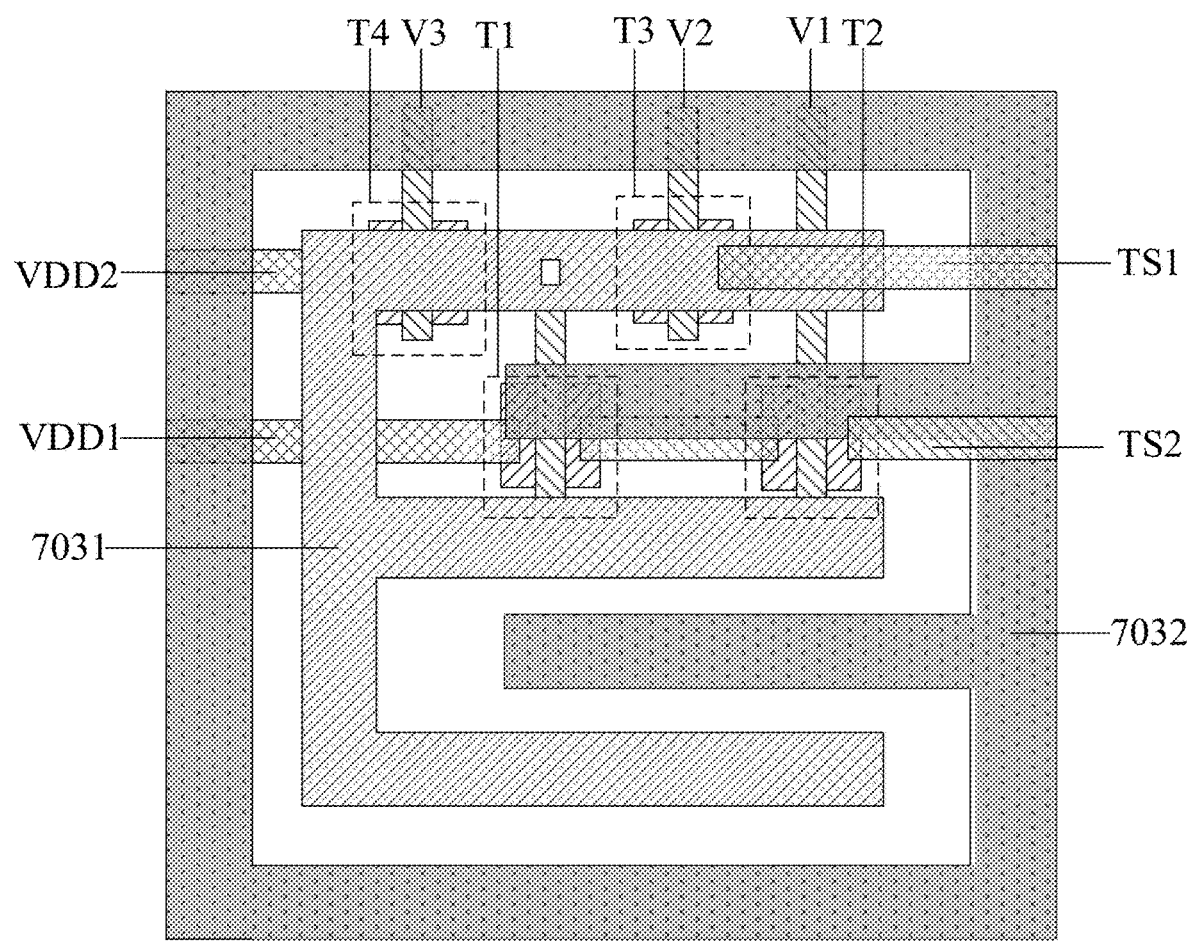

Specifically, when the photoelectric sensor S is the MSM-type photosensor 703, as shown in FIG. 8, the photoelectric sensor S includes: a first electrode 7031 coupled with the corresponding photoelectric detection circuit 702; a second electrode 7032 arranged at the same layer with the first electrode 7031; a dielectric layer 7034 located on a side, facing away from the base substrate 701, of the layer where the first electrode 7031 and the second electrode 7032 are located; and a semiconductor layer 7035 located on a side, facing away from the base substrate 701, of the dielectric layer 7034; where the first electrode 7031 and the second electrode 7032 constitute an interdigital electrode, as shown in FIG. 9 and FIG. 10.

During specific implementation, the first power end VDD1, the second power end VDD2, the detection signal receiving end TS and the source electrodes and drain electrodes of the transistors may be arranged at the same layer. It can be seen from FIG. 9 and FIG. 10 that orthographic projections of the first power end VDD1, the second power end VDD2 and the detection signal receiving end TS on the base substrate 701 overlap with an orthographic projection of the first electrode 7031 on the base substrate 701; orthographic projections of the transistors on the base substrate 701 overlap with an orthographic projection of the first electrode 7031 and an orthographic projection of the second electrode 7032 on the base substrate 701 receptively; and an extension direction of a data line (not shown in FIG. 9 and FIG. 10) is the same with an extension direction (namely a horizontal direction in FIG. 9 and FIG. 10) of the interdigital electrode, and an extension direction of a scanning line (not shown in FIG. 9 and FIG. 10) is the same with a direction (namely a vertical direction in FIG. 9 and FIG. 10) perpendicular to the extension direction of the interdigital electrode. Since the transistors and the MSM-type photoelectric sensor S are a vertical structure, the number of the transistors cannot affect an induction area of the MSM-type photoelectric sensor S.

Based on this, the passive mode (PPS) and the active mode (APS) are fused in the same MSM-type ray detector, which can not only increase a dynamic range and gains of the detector, but also obtain color X-ray images by using high-dosage and low-dosage imaging.

Optionally, the above detection substrate provided by the embodiments of the present disclosure, as shown in FIG. 7 and FIG. 8, may further include: a gate insulation layer 704, an interlayer dielectric layer 705, an insulation layer 706 and a passivation layer 707.

Based on the same inventive concept, embodiments of the present disclosure further provide a ray detector, including the above detection substrate provided by the embodiments of the present disclosure. There are other essential components of the ray detector that ordinary skilled in the art should understand, which is not repeated herein, and should not limit the present disclosure. In addition, since the principle of the ray detector for solving the problem is the same with the principle of the above detection substrate for solving the problem, implementation of the ray detector may refer to the embodiments of the above detection substrate, and the repetition is omitted.

According to the above photoelectric detection circuit, the driving method therefor, and the detection substrate and the ray detector provided by the embodiments of the present disclosure, the photoelectric detection circuit includes: the storage circuit, the amplification circuit, the first reading circuit and the second reading circuit; the storage circuit is coupled with the output end of the photoelectric senor, the storage circuit is configured to store the first photocurrent signal generated by the photoelectric sensor according to the received ray with the first radiation dosage, and write the first photocurrent signal into the control end of the amplification circuit; or, the storage circuit is configured to store the second photocurrent signal generated by the photoelectric sensor according to the received ray with the second radiation dosage, and write the second photocurrent signal into the input end of the second reading circuit; where the first radiation dosage of the ray is smaller than the second radiation dosage of the ray; the first reading circuit is coupled with the detection signal receiving end, and the first reading circuit is configured to write, under the control of the first scanning signal end, the first photocurrent signal amplified by the amplification circuit into the detection signal receiving end; and the second reading circuit is coupled with the detection signal receiving end, and the second reading circuit is configured to write, under the control of the second scanning signal end, the second photocurrent signal into the detection signal receiving end. Since the first photocurrent signal generated by the photoelectric sensor and stored by the storage circuit is amplified by the amplification circuit, and then written into the detection signal receiving end by the first reading circuit, so that the photoelectric detection function in the active mode is realized; the first photocurrent signal generated by the photoelectric sensor and stored by the storage circuit is directly written into the detection signal receiving end by the second reading circuit, so that the photoelectric detection function in the passive mode is realized; and therefore, the photoelectric detector of the present disclosure is compatible with the active mode and the passive mode, and simultaneously has the advantages of the two modes.

It will be apparent to those skilled in the art that various modifications and variations may be made to the present disclosure without departing from the spirit or scope of the present disclosure. In this way, if these modifications and variations of the present disclosure fall within the scope of the claims of the present disclosure and their equivalent art, the present disclosure also intends to include these modifications and variations.

What is claimed is:
1. A detection substrate, comprising:
a base substrate;
photoelectric detection circuits arranged on the base substrate in an array; and
photoelectric sensors arranged on sides, facing away from the base substrate, of the photoelectric detection circuits and coupled with the photoelectric detection circuits in a one-to-one correspondence mode;
wherein the photoelectric detection circuit comprises:
a storage circuit, coupled with an output end of a photoelectric sensor; wherein the storage circuit is configured to store a first photocurrent signal generated by the photoelectric sensor according to a received ray with a first radiation dosage, and store a second photocurrent signal generated by the photoelectric sensor according to a received ray with a second radiation dosage, and the first radiation dosage of the ray is smaller than the second radiation dosage of the ray;
an amplification circuit, coupled with the storage circuit; wherein the amplification circuit is configured to amplify and then output the first photocurrent signal written;
a first reading circuit, coupled with an output end of the amplification circuit and a detection signal receiving end respectively; wherein the first reading circuit is configured to write, under a control of a first scan- ning signal end, the first photocurrent signal amplified by the amplification circuit into the detection signal receiving end; and a second reading circuit, coupled with the storage circuit and the detection signal receiving end receptively; wherein the second reading circuit is configured to write, under a control of a second scanning signal end, the second photocurrent signal into the detection signal receiving end;

wherein each of the photoelectric sensors comprises: a first electrode coupled with a corresponding photoelectric detection circuit; a second electrode arranged on the same layer as the first electrode; a dielectric layer arranged on a side, facing away from the base substrate, of the layer where the first electrode and the second electrode are arranged; and a semiconductor layer arranged on a side, facing away from the base substrate, of the dielectric layer; wherein the first electrode and the second electrode constitute an interdigital electrode.

2. The detection substrate according to claim 1, wherein the detection signal receiving end is unique.

3. The detection substrate according to claim 1, wherein the detection signal receiving end comprises a first detection signal end and a second detection signal end;

the first detection signal end is coupled with the first reading circuit; and the second detection signal end is coupled with the second reading circuit.

4. The detection substrate according to claim 1, wherein the storage circuit comprises a capacitor, one end of the capacitor is grounded, and the other end of the capacitor is coupled with the output end of the photoelectric sensor.

5. The detection substrate according to claim 1, wherein the amplification circuit comprises a first transistor, a gate of the first transistor is coupled with the output end of the photoelectric sensor, and a first electrode of the first transistor is coupled with a first power end.

6. The detection substrate according to claim 5, wherein the first reading circuit comprises a second transistor;

wherein a gate of the second transistor is coupled with the first scanning signal end, a first electrode of the second transistor is coupled with a second electrode of the first transistor, and the second electrode of the second transistor is coupled with the detection signal receiving end.

7. The detection substrate according to claim 1, wherein, the second reading circuit comprises a third transistor;

wherein a gate of the third transistor is coupled with the second scanning signal end, a first electrode of the third transistor is coupled with the output end of the photoelectric sensor, and the second electrode of the third transistor is coupled with the detection signal receiving end.

8. The detection substrate according to claim 1, further comprising: a reset circuit;

wherein the reset circuit is coupled with the output end of the photoelectric sensor; and the reset circuit is configured to reset, under a control of a third scanning signal end, the output end of the photoelectric sensor by using a second power end.

9. The detection substrate according to claim 8, wherein the reset circuit comprises a fourth transistor;

wherein a gate of the fourth transistor is coupled with the third scanning signal end, a first electrode of the fourth transistor is coupled with the second power end, and the second electrode of the fourth transistor is coupled with the output end of the photoelectric sensor.

10. A driving method of the detection substrate according to claim 1, comprising:

in an accumulating period, when the ray with the first radiation dosage is applied to the photoelectric sensor, storing the first photocurrent signal generated by the photoelectric sensor according to the ray with the first radiation dosage through the storage circuit; when the ray with the second radiation dosage is applied to the photoelectric sensor, storing the second photocurrent signal generated by the photoelectric sensor according to the ray with the second radiation dosage through the storage circuit; wherein the first radiation dosage of the ray is smaller than the second radiation dosage of the ray; and in a reading period, when the storage circuit stores the first photocurrent signal, loading the first scanning signal to the first scanning signal end, so that the first reading circuit writes the first photocurrent signal amplified by the amplification circuit into the detection signal receiving end; and when the storage circuit stores the second photocurrent signal, loading the second scanning signal to the second scanning signal end, so that the second reading circuit writes the second photocurrent signal stored by the storage circuit into the detection signal receiving end.

11. The driving method according to claim 10, wherein, before the accumulating period, further comprising:

in a reset period, loading a third scanning signal to a third scanning signal end, so that a reset circuit resets the output end of the photoelectric sensor by using a second power end.

12. The detection substrate according to claim 1, wherein same film layers with same function of transistors comprised in each of the photoelectric detection circuits are arranged on the same layer;

one end of a capacitor and a gate of at least one of the transistors are arranged on the same layer, and the other end of the capacitor is arranged on the same layer as a first electrode and a second electrode of at least one of the transistors.

13. The detection substrate according to claim 12, wherein each of the photoelectric sensors comprises:

a first electrode coupled with a corresponding photoelectric detection circuit;

a second electrode arranged on a side, facing away from the base substrate, of the first electrode; and a P-type semiconductor layer, an intrinsic semiconductor layer and an N-type semiconductor layer stacked between the first electrode and the second electrode.

14. A ray detector, comprising the detection substrate according to claim 1.

* * * * *